(12) United States Patent
Reis et al.

(10) Patent No.: US 7,505,275 B2
(45) Date of Patent: Mar. 17, 2009

(54) LED WITH INTEGRAL VIA

(75) Inventors: Bradley E. Reis, Westlake, OH (US); James R. Cartiglia, Nashville, TN (US)

(73) Assignee: GrafTech International Holdings Inc., Parma, OH (US)

( * ) Notice: Subject to any disclaimer, the term of this patent is extended or adjusted under 35 U.S.C. 154(b) by 233 days.

(21) Appl. No.: 11/377,662

(22) Filed: Mar. 10, 2006

(65) Prior Publication Data
US 2007/0139895 A1    Jun. 21, 2007

Related U.S. Application Data

(63) Continuation-in-part of application No. 11/267,933, filed on Nov. 4, 2005.

(51) Int. Cl.
*H05K 7/20* (2006.01)
(52) U.S. Cl. .......... 361/717; 361/719; 257/79; 257/99; 165/80.3; 165/185
(58) Field of Classification Search .......... 361/710, 361/719, 703, 707, 717; 165/80.3, 185, 46, 165/172; 257/13–14, 79, 99; 174/16.3; 428/195.1; 313/600
See application file for complete search history.

(56) References Cited

U.S. PATENT DOCUMENTS

| | | | |
|---|---|---|---|
| 3,404,061 A | 10/1968 | Shane et al. ............... 161/125 |
| 3,678,995 A | 7/1972 | Collard ....................... 165/185 |
| 4,234,638 A | 11/1980 | Yamazoe et al. ............ 428/133 |
| 4,739,448 A * | 4/1988 | Rowe et al. ................. 361/719 |
| 4,782,893 A | 11/1988 | Thomas ....................... 165/185 |
| 4,812,792 A | 3/1989 | Leibowitz ................... 333/238 |
| 4,878,152 A | 10/1989 | Sauzade et al. ............. 361/386 |
| 4,895,713 A | 1/1990 | Greinke et al. ............. 423/448 |
| 4,961,991 A | 10/1990 | Howard ....................... 428/246 |
| 5,192,605 A | 3/1993 | Mercuri et al. ............. 428/224 |
| 5,224,030 A | 6/1993 | Banks et al. ................ 361/386 |
| 5,255,738 A | 10/1993 | Przilas ........................ 165/185 |
| 5,287,248 A | 2/1994 | Montesano ................. 361/708 |
| 5,316,080 A | 5/1994 | Banks et al. ................ 165/185 |
| 5,366,688 A | 11/1994 | Terpstra et al. ............. 419/36 |
| 5,461,201 A * | 10/1995 | Schonberger et al. ...... 174/16.3 |
| 5,509,993 A | 4/1996 | Hirschvogel ................ 156/326 |
| 5,542,471 A * | 8/1996 | Dickinson .................. 165/170 |
| 5,660,917 A * | 8/1997 | Fujimori et al. .......... 428/195.1 |
| 5,902,762 A | 5/1999 | Mercuri et al. ............. 501/99 |
| 5,944,097 A * | 8/1999 | Gungor et al. ............. 165/185 |
| 5,958,572 A | 9/1999 | Schmidt et al. ............ 428/320 |
| 6,027,807 A | 2/2000 | Inoue et al. ................ 428/408 |
| 6,060,166 A * | 5/2000 | Hoover et al. .............. 428/408 |
| 6,075,701 A | 6/2000 | Ali et al. .................... 361/704 |
| 6,131,651 A | 10/2000 | Richey, III ................. 165/185 |

(Continued)

OTHER PUBLICATIONS

U.S. Patent Application Publication No. US/2003/0098651, May 29, 2003 Lin et al.

(Continued)

*Primary Examiner*—Jatprakash N Gandhi
*Assistant Examiner*—Courtney L Smith
(74) *Attorney, Agent, or Firm*—James R. Cartiglia; Waddey & Patterson, PC

(57) ABSTRACT

A light emitting diode comprising a body and a thermal via integral therewith and which extends from the body.

12 Claims, 1 Drawing Sheet

U.S. PATENT DOCUMENTS

| | | | | |
|---|---|---|---|---|
| 6,141,216 A | | 10/2000 | Holung et al. | 361/687 |
| 6,147,869 A | * | 11/2000 | Furnival | 361/719 |
| 6,208,513 B1 | | 3/2001 | Fitch et al. | 361/704 |
| 6,278,613 B1 | * | 8/2001 | Fernandez et al. | 361/719 |
| 6,362,964 B1 | * | 3/2002 | Dubhashi et al. | 361/707 |
| 6,503,626 B1 | | 1/2003 | Norley et al. | 428/408 |
| 6,538,892 B2 | | 3/2003 | Smalc | 361/710 |
| 6,555,223 B2 | | 4/2003 | Kubo | 428/408 |
| 6,673,289 B2 | | 1/2004 | Reynolds, III et al. | 264/115 |
| 6,706,400 B2 | | 3/2004 | Mercuri et al. | 428/408 |
| 6,749,010 B2 | * | 6/2004 | Getz et al. | 165/80.3 |
| 6,758,263 B2 | | 7/2004 | Krassowski et al. | 165/185 |
| 6,771,502 B2 | * | 8/2004 | Getz et al. | 361/703 |
| 6,886,249 B2 | | 5/2005 | Smalc | 29/890.03 |
| 6,930,885 B2 | | 8/2005 | Barcley | 361/719 |
| 7,077,585 B2 | * | 7/2006 | Ito | 607/104 |
| 7,102,172 B2 | * | 9/2006 | Lynch et al. | 257/79 |
| 7,176,502 B2 | * | 2/2007 | Mazzochette et al. | 257/99 |
| 7,303,005 B2 | * | 12/2007 | Reis et al. | 165/185 |
| 2005/0116235 A1 | * | 6/2005 | Schultz et al. | 257/79 |
| 2005/0161682 A1 | * | 7/2005 | Mazzochette et al. | 257/79 |
| 2006/0191675 A1 | * | 8/2006 | Fletcher et al. | 165/172 |
| 2007/0102142 A1 | * | 5/2007 | Reis et al. | 165/80.3 |

OTHER PUBLICATIONS

U.S. Patent Application Publication No US/2003/0116312, Jun. 26, 2003 by Krassowski et al.

* cited by examiner

LED WITH INTEGRAL VIA

RELATED APPLICATION

This application is a continuation-in-part of copending and commonly assigned application Ser. No. 11/267,933, entitled "Heat Spreading Circuit Assembly," filed in the name of Reis et al. on Nov. 4, 2005, the disclosure of which is incorporated herein by reference.

TECHNICAL FIELD

The present invention relates to a light emitting diode (LED) having an integral thermal via which provides improved heat transfer of heat generated by the LED to a heat spreader, heat sink, or the like.

BACKGROUND OF THE INVENTION

Printed circuit boards are conventionally manufactured from dielectric materials such as glass fiber laminates (known as FR4 boards), polytetrafluoroethylene, and like materials. On one of the surfaces of such boards, or between layers of dielectric materials, are circuits, usually formed of copper. The circuits are commonly formed by photolithographic methods, sputtering, screen printing or the like (for circuits disposed between layers, the circuit is applied to the dielectric material before formation of the laminate). In addition, LEDs are often disposed on the surface of the boards, in contact with the circuits on the surface, and can generate substantial amounts of heat that must be dissipated for the LEDs to operate reliably and to their intended performance levels As a result of the presence of LEDs, the amount of heat that print circuit boards must help dissipate can be significant. So called "thermal boards" are being developed where a layer of a heat spreading material such as copper or aluminum and alloys thereof is laminated with the dielectric material, on the surface opposite or in layers opposing that of the circuit and heat-generating components, to act as a heat spreader for the heat generated from the electronic components. It is important that the heat spreader be located such that at least one layer of dielectric material separates the heat spreader from the circuit(s), since the heat spreader materials are typically electrically conductive, and would interfere with the operation of the circuits if they were in contact.

There are several commercially available "thermal boards," sometimes called metal core printed circuit boards (MCPCB), such as Insulated Metal Substrate™ thermal boards from The Bergquist Company, T-Clad™ thermal boards from Thermagon, HITT Plate boards from Denka, and Anotherm™ boards from TT Electronics. These thermal boards utilize thermally conductive dielectric layers, either through filling the dielectric layer with thermally conductive particles as in the case of the first three, or as in the case of the Anotherm solution, through a thin anodization layer on top of the aluminum heat spreader layer. The use of thermally conductive particles can be expensive, however, and the subsequent layer must be thick enough to ensure it is pin-hole free, adding to thermal resistance in the design. Additional limitations of this approach arise from the lack of flexibility to fabricate bent or non-planar circuit structures, and the fact that the dielectric material covers the entire surface of the heat spreader layer. The use of anodization as the dielectric layer attempts to overcome some of these issues, but forces the use of aluminum as its heat spreader layer, since copper cannot be anodized. Since the thermal conductivity of aluminum is significantly less than that of copper, this can be a thermal disadvantage. All of the foregoing approaches, however, can suffer soldering difficulties, since the same heat dissipation properties that are useful during the operation of the printed circuit board and components, inhibit an assembly process that requires point sources of heat for soldering (such as hot bar bonding, for example).

To overcome some, but not all of these issues, traditional printed circuit boards can be married to a separate metal heat spreader layer in a separate process. In this arrangement, the printed circuit board can be designed with thermal vias (typically drilled holes that are plated with copper) to conduct heat better through the unfilled dielectric layer of the printed circuit board, but these may only be used in applications where electrical isolation from component to component is not required.

Moreover, traditional heat spreading materials like copper or aluminum also add significant weight to the board, which is undesirable, and the coefficient of thermal expansion (CTE) of these materials may not closely match that of the glass fiber laminate, leading to physical stress on the printed circuit board with the application of heat and, potentially, delamination or cracking.

Additionally, since the heat spreader layer on these boards is comprised of an isotropic, thin (relative to its length and width) metal material, heat tends to flow through the thickness of the heat spreader readily, and resulting hot-spots can occur in the location directly opposite the heat source.

Another type of circuit assembly, referred to in the industry as a "flex circuit," provides similar heat management problems. Flex circuits are formed by providing a circuit, such as a copper circuit as described above, on the surface of a polymer material, such as a polyimide or polyester, which functions as the dielectric layer. As the name suggests, these circuit materials are flexible and can even be provided as rolls of circuit materials that can later be married to a heat spreader layer like copper or aluminum. While very thin, the dielectric layer in flex circuits still adds appreciably to the thermal resistance in a given design, and suffers from some of the same issues observed in printed circuit boards. The use of thermal vias is still limited to electrically isolating applications as described previously. And as is apparent, the use of rigid metallic layers, such as of copper or aluminum, does not allow one to take advantage of the flexibility of flex circuits, where such a characteristic is important in an end-use application.

The use of an LED in operative contact with a thermal pathway extending through to a heat spreader, especially one formed of sheet(s) of compressed particles of exfoliated graphite or a heat sink or other thermal dissipation article can remedy many of the disadvantages encountered with the use of copper or aluminum heat spreaders.

The use of various solid structures as heat transporters is known in the art. For example, Banks, U.S. Pat. Nos. 5,316, 080 and 5,224,030 discloses the utility of diamonds and gas-derived graphite fibers, joined with a suitable binder, as heat transfer devices. Such devices are employed to passively conduct heat from a source, such as a semiconductor, to a heat sink.

In U.S. Pat. No. 6,758,263, Krassowski and Chen disclose the incorporation of a high conducting insert into a heat dissipating component such as a graphite heat sink base in order to conduct heat from a heat source through the thickness of the component, and from there in a planar direction. However, nothing in the Krassowski and Chen disclosure describes conducting heat from a heat source through layers of a relatively non-conductive material like a dielectric layer of a circuit assembly.

SUMMARY OF THE INVENTION

It is an object of the invention to provide an LED having a thermal via to facilitate heat transfer from the LED to a thermal dissipation article, such as a heat spreader or a heat sink.

It is a further object of the invention to provide a circuit assembly having a heat spreader layer on one surface thereof and a thermal pathway for heat from an LED located at the other surface thereof to flow towards the heat spreader layer.

It is yet another object of this invention to provide a circuit assembly having a heat spreader layer on one surface thereof and a thermal pathway integral with an LED for heat transfer from the LED located at the other surface thereof to the heat spreader layer.

It is still another object of the invention to provide an LED having a thermal pathway integral therewith positioned across a dielectric material interposed between a heat-generating component and a graphite-based heat spreader layer in a circuit assembly.

These and other objects are accomplished by the present invention, which provides an LED having a thermally conductive element in operative contact therewith, for forming a thermal pathway between the LED and, for instance, a heat spreader layer in a circuit assembly comprising at least one layer of a dielectric material positioned between a heat spreader layer and the LED. Most preferably, the thermally conductive element is integral with the LED.

Other and further objects, features, and advantages of the present invention will be readily apparent to those skilled in the art, upon a reading of the following disclosure when taken in conjunction with the accompanying drawings.

DETAILED DESCRIPTION OF THE DRAWINGS

This invention is based upon the finding that the heat spreading function of a heat spreader layer on a circuit assembly is substantially improved when a thermal pathway between an LED, and the heat spreader layer is provided. Indeed, by the use of such a thermal pathway, the use of graphite-based heat spreader layers can provide improved heat spreading, even as compared to the use of aluminum or copper heat spreaders, with the added benefit of reduced weight.

By the term "circuit assembly" is meant an assembly including one or more electronic circuits positioned on a dielectric material, and can include laminates where one or more of the circuits is sandwiched between layers of dielectric material. Specific examples of circuit assemblies are printed circuit boards and flex circuits, as would be familiar to the skilled artisan.

Figure 1:
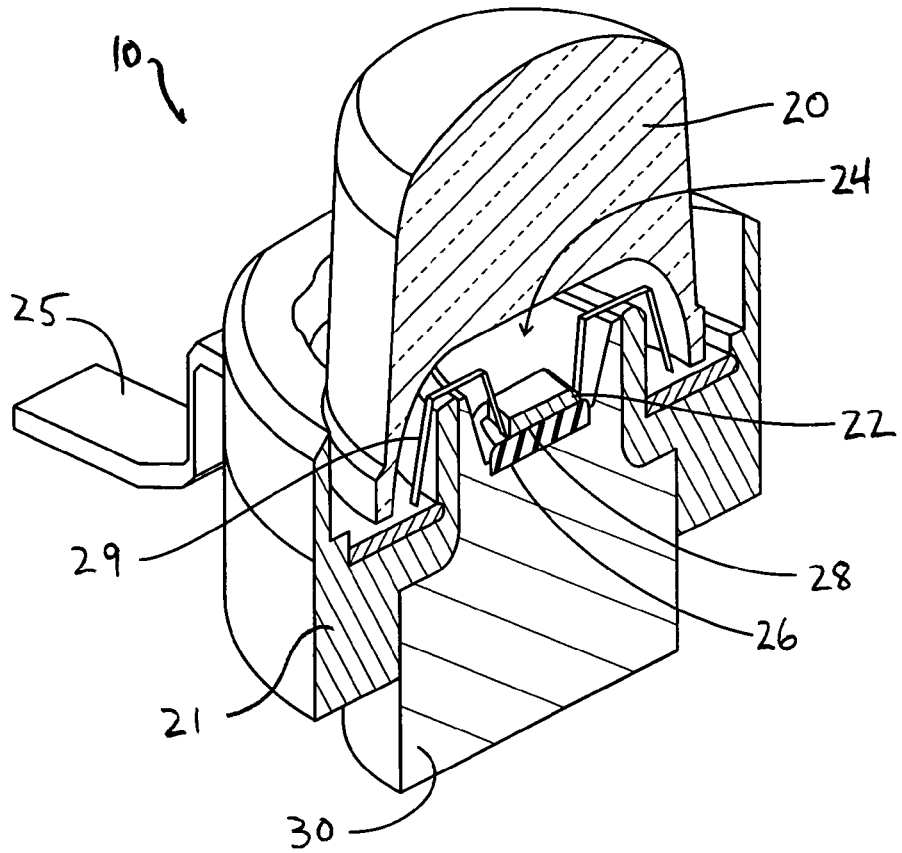
FIG. 1 is a partially broken away schematic view of an LED having an integral thermal pathway in accordance with the present invention.

Referring now to the drawings, and, in particular, FIG. 1, an LED in accordance with the present invention is denoted by the reference numeral 10. LEDs typically include a body 21, including a lens 20, usually formed of a plastic material, a semiconductor chip 22, an encapsulant, such as a silicone encapsulant 24 about chip 22, a lead 25 for powering chip 22, a mount 26 on which chip 22 sits, often with a thermal interface 28 therebetween, and a wire connection 29 between lead 25 and chip 22.

In accordance with the present invention, LED 10 further comprises a high thermal conductivity thermal slug or via 30, which forms a thermal pathway for moving heat generated by chip 22 to a thermal dissipation article such as a heat spreader or a heat sink (not shown). Thermal via 30 is formed of a thermally conductive material, such as a metal like copper or alloy thereof, or aluminum or alloys thereof, or a graphite article, especially one formed of compressed particles of exfoliated graphite. Thermal via 30 extends beyond the body 21 of LED 10 to provide a thermal pathway from chip 22 to a heat dissipation article which is not located directly adjacent LED 10. Indeed, thermal via 30 should extend beyond body 21 of LED 10 to bridge the gap between body 21 and a heat dissipation article, such as a heat spreader or a heat sink, and extend through any article between body 21 and the thermal dissipation article, such as a dielectric material or the like.

By "high thermal conductivity" is meant that the thermal conductivity of thermal via 30 in the direction between LED 10 and a heat dissipation article, such as a heat spreader is greater than the through-thickness thermal conductivity of any material (including air) which is positioned between LED 10 and the heat dissipation article; preferably, the thermal conductivity of thermal via 30 is at least about 100 W/m°K, more preferably at least about 200 W/m°K, and even more preferably above 350 W/m°K. Thermal via 30 can assume any particular cross-sectional shape, although most commonly, thermal via 30 will be cylindrical in shape.

Figure 2:
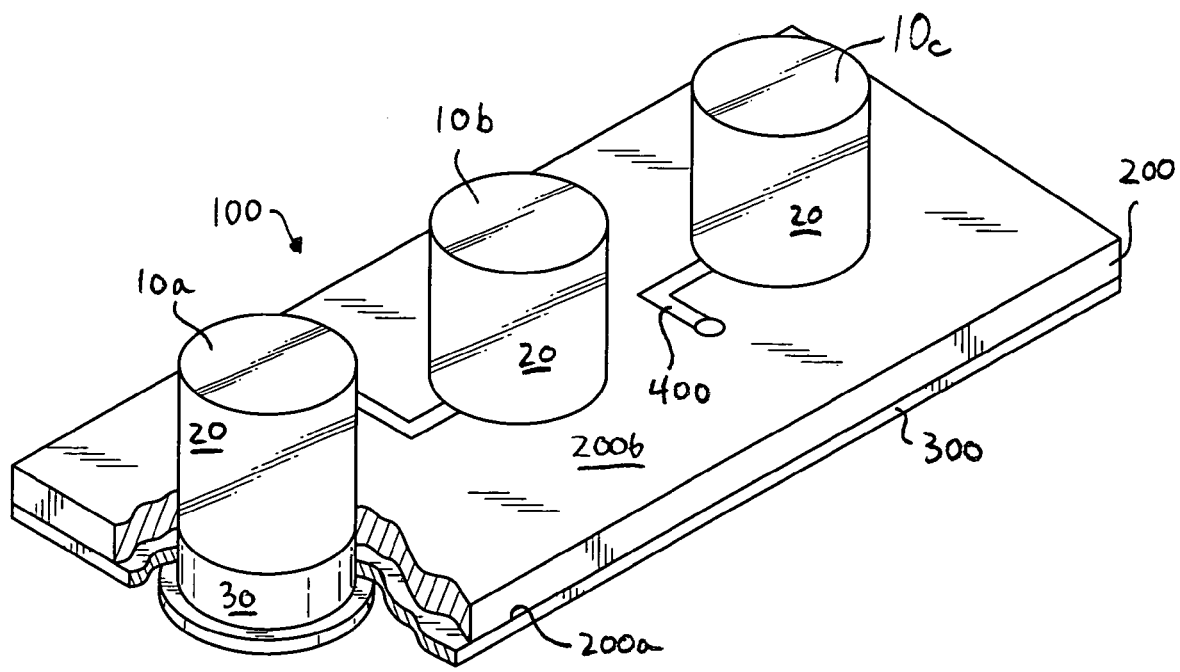
FIG. 2 is a partially broken-away perspective view of a circuit assembly in accordance with the present invention, having a heat spreader layer on one surface thereof and an LED incorporating a thermal pathway between the heat spreader layer and the LED.

Referring now to FIG. 2, one preferred environment for use of inventive LED 10 is in a circuit assembly 100. Circuit assembly 100 includes at least a dielectric layer 200 and a heat spreader layer 300, where heat spreader layer 300 abuts dielectric layer 200. Preferably, heat spreader layer 300 comprises at least one sheet of compressed particles of exfoliated graphite. Circuit assembly 100 is generally either a printed circuit board or flex circuit, but can also comprise, for example, a printed or silk-screened pattern of conductive ink on dielectric layer 200.

Circuit assembly 100 also generally comprises a circuit 400 thereon, conventionally formed of copper, applied to dielectric layer 200 by photolithographic methods, sputtering, screen printing or the like. As noted above, circuit 400 can also be formed of a conductive ink applied to dielectric layer 200 by, for example, printing or silk-screening processes.

Dielectric layer 200 can be that conventional in the printed circuit board industry, such as glass fiber with resin (FR-4), preferably formed as a laminate; polytetrafluoroethylene (PTFE), commercially available as Teflon brand materials; and expanded PTFE, sometimes denoted ePTFE, as well as resin-impregnated or -imbibed versions of the foregoing. In addition, dielectric layer 200 can be a polymer such as a polyimide or polyester, as used in the formation of flex circuits. Dielectric layer 200 can also comprise a ceramic material, such as aluminum nitride, aluminum oxide or alumina, present as a discrete layer, or applied to a substrate layer (such as heat spreader layer 300) through, for example, an anodization, vapor deposition, or flame-spraying process; the use of anodization is especially relevant where heat spreader layer 300 is aluminum.

Preferably, heat spreader layer 300 is from about 0.25 mm to about 25 mm in thickness, more preferably from about 0.5 mm to about 14 mm in thickness, and comprises at least one graphite sheet. Advantageously, heat spreader layer 300 can be a laminate of up to ten or more graphite sheets, to provide the desired heat spreading capabilities. The graphite composite can be used to at least partially, and, in the preferred embodiments, completely replace the use of copper or other metals as the circuit assembly heat spreader.

The graphite/dielectric material laminate can be formed by laminating together dielectric layers 200 and heat spreader layer 300 in a manner conventional in the formation of circuit assembly laminates, using conventional adhesives, for instance. Alternatively, graphite/dielectric material laminate can be formed in the pre-pressed stack while pressure curing the graphite materials. The epoxy polymer in the impregnated graphite sheets is sufficient, upon curing, to adhesively bond the non-graphite as well as the impregnated graphite layers of the structure into place. In any event, in the preferred embodiment, a graphite composite is employed as heat spreader layer 300 for circuit assembly 100, to replace the copper or aluminum heat spreader in a so-called "metal-backed" printed circuit board or in a flex circuit.

As noted above, dielectric material 200 forming the central portion of circuit assembly 100 has two major surfaces 200a and 200b. Heat spreader layer 300 abuts one of the surfaces 200a of dielectric material 200; the other surface 200b has located thereon at least one LED 10, and often a plurality of LEDs 10a, 10b, 10c, etc. as would be familiar to the skilled artisan. LED 10 is located so as to be in contact with a portion of circuit 400 lying on surface 200b of circuit assembly 100 on which LED 10 is located.

As noted, in order to facilitate the transfer of heat from LED 10 to heat spreader layer 300, thermal via 30 extends through heat spreader layer 300.

Thermal via 30 may advantageously have a shoulder or step on the side adjacent dielectric layer 200, for positional considerations. If electrical isolation is required a dielectric layer, such as anodized aluminum, aluminum nitride, aluminum oxide or alumina, can be placed onto some or all surfaces of the thermal via 30, like flame-sprayed or vapor deposited alumina on copper, or through the use of anodized aluminum as thermal via 30, for example. In addition, surfaces of thermal via 30 can remain solderable, or can be plated to be solderable, to facilitate joinder of LED 10 to thermal via 30.

Thermal via 30 extends into heat spreader layer 300 and is brought into thermal contact with heat spreader layer 300. For instance, thermal via 30 can be fitted into a slot or hole in heat spreader layer 300 using a thermal adhesive or a pressure fitting, such as a so-called "speed nut," in order to ensure good thermal contact between thermal via 30 and heat spreader layer 300, and to ensure heat transfer from thermal via 30 across the thickness of spreader layer 300. One suitable way thermal via 30 is fitted into spreader layer 300 so as to establish adequate thermal contact is to force thermal via 30 through an opening in spreader layer 300 which has a diameter smaller than that of thermal pathway 60; in this way, the act of forcing thermal via 30 through the opening provides a pressure fitting between the two. Alternatively, the hole in spreader layer 300 can be formed by using thermal via 30 itself as a punch. The nature of sheets of compressed particles of exfoliated graphite can permit such a fitting to be accomplished without undue damage to either thermal via 30 or heat spreader layer 300.

One advantageous method for providing good thermal contact between thermal via 30 and heat spreader layer 300 is by the use of a "rivet"-type thermal via 30. In this way, in the same manner a rivet is compressed to seal against a substrate, a rivet-style thermal via 30 can be compressed or forced to seal against the outer surface of heat spreader layer 300 (i.e., the surface not abutting the dielectric layer), creating a good thermal connection between the two.

Most preferably, thermal via 30 has a length approximately equal to the combined thickness of dielectric layer 200 and heat spreader layer 300, plus any distance thermal via 30 extends from either dielectric layer 200 or heat spreader layer 300, as shown in FIG. 2. Of course, if thermal via 30 does not pass completely through heat spreader layer 200, its length does not have to be equal to the combined thickness of dielectric layer 200 and heat spreader layer 300. In a more general sense, the length of thermal via 30 is dependent on the distance for which heat transfer from LED 10 to a thermal dissipation article is desired.

As noted above, heat spreader layer 300 is advantageously laminated or adhered to dielectric layer 200. However, it is contemplated that the use of thermal via 30 can permit a gap to be present between heat spreader layer 300 and dielectric layer 200, to optimize heat dissipation. In other words, since heat transfer between LED 10 and heat spreader layer 300 is primarily through thermal via 30, as opposed to primarily through dielectric layer 200, it is not necessary for heat spreader layer 300 to be in physical contact with dielectric layer 200. Thus, a gap, of about 1 mm or even greater, can be provided between heat spreader layer 300 and dielectric layer 200, such as by the use of spacers, etc. (not shown). In this way, provided heat spreader layer 300 remains in thermal contact with thermal via 30, more surface area of heat spreader layer 300 is exposed, and more heat can be dissipated therefrom.

Accordingly, by the use of the present invention, effective heat dissipation from an LED thereon can be accomplished to a degree not heretofore seen.

All cited patents, patent applications and publications referred to in this application are incorporated by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A circuit assembly comprising a substrate which comprises a dielectric layer, a heat spreader layer which comprises at least one sheet of compressed particles of exfoliated graphite, wherein the heat spreader layer is located at a first surface of the substrate, a light emitting diode and a circuit located at a second surface of the substrate, the light emitting diode comprising a body and a thermal via integral therewith, wherein the thermal via extends from the body through the dielectric layer and further wherein the heat spreader layer has an opening therein into which the thermal via extends such that it is in thermal connection with the heat spreader layer.

2. The circuit assembly of claim 1, wherein the dielectric layer comprises a material selected from the group consisting of glass fiber impregnated with resin; polytetrafluoroethylene; expanded polytetrafluoroethylene; a polymer; a ceramic material; or combinations thereof.

3. The circuit assembly of claim 1, wherein the dielectric layer comprises anodized aluminum, aluminum nitride, aluminum oxide or alumina.

4. The circuit assembly of claim 1, wherein the thermal via comprises a high thermal conductivity material.

5. The circuit assembly of claim 4, wherein the thermal conductivity of the thermal via is greater than the through-thickness thermal conductivity of the dielectric layer.

6. The circuit assembly of claim 4, wherein the thermal via comprises copper, aluminum, or alloys thereof.

7. The circuit assembly of claim 1, further comprising a dielectric layer on the thermal via, wherein the dielectric layer comprises anodized aluminum, aluminum nitride, aluminum oxide or alumina.

8. A circuit assembly comprising a substrate comprising a dielectric layer, a light emitting diode and a circuit located at a surface of the substrate, a heat spreader layer which comprises at least one sheet of compressed particles of exfoliated graphite, the heat spreader layer located at a surface of the substrate, wherein the light emitting diode is in thermal connection with the heat spreader layer through a thermal via integral therewith, where the thermal via extends from the light emitting diode through the dielectric layer and further wherein the heat spreader layer has an opening therein into which the thermal via extends.

9. The circuit assembly of claim 8, wherein the dielectric layer is disposed between the heat spreader layer and the circuit.

10. The circuit assembly of claim 8, wherein the dielectric layer comprises a material selected from the group consisting of glass fiber impregnated with resin; polytetrafluoroethylene; expanded polytetrafluoroethylene; a polymer; a ceramic material; or combinations thereof.

11. The circuit assembly of claim 8, wherein the dielectric layer comprises anodized aluminum, aluminum nitride, aluminum oxide or alumina.

12. The circuit assembly of claim 8 wherein the thermal via is sized to extend through the dielectric layer.

* * * * *